(12) United States Patent
Yabu et al.

(10) Patent No.: US 11,492,432 B2
(45) Date of Patent: Nov. 8, 2022

(54) RESIN FOR NANOIMPRINTING, LAMINATE CONTAINING RESIN FOR NANOIMPRINTING, PRINTED BOARD CONTAINING RESIN FOR NANOIMPRINTING, AND METHOD FOR PRODUCING NANOIMPRINT SUBSTRATE

(71) Applicant: Japan Science and Technology Agency, Kawaguchi (JP)

(72) Inventors: Hiroshi Yabu, Sendai (JP); Yuta Saito, Sendai (JP)

(73) Assignee: Japan Science and Technology Agency, Kawaguchi (JP)

( * ) Notice: Subject to any disclaimer, the term of this patent is extended or adjusted under 35 U.S.C. 154(b) by 362 days.

(21) Appl. No.: 16/818,003

(22) Filed: Mar. 13, 2020

(65) Prior Publication Data
US 2020/0223125 A1    Jul. 16, 2020

Related U.S. Application Data

(62) Division of application No. 14/649,735, filed as application No. PCT/JP2013/080635 on Nov. 13, 2013, now abandoned.

(30) Foreign Application Priority Data

Dec. 5, 2012    (JP) .................................. 2012-266628

(51) Int. Cl.
*C08F 220/54*    (2006.01)
*B32B 27/00*    (2006.01)
(Continued)

(52) U.S. Cl.
CPC .......... *C08F 220/54* (2013.01); *B29C 59/005* (2013.01); *B29C 59/022* (2013.01);
(Continued)

(58) Field of Classification Search
CPC ...................................................... G03F 7/0002
See application file for complete search history.

(56) References Cited

U.S. PATENT DOCUMENTS

2009/0215925 A1    8/2009    Urban et al.

FOREIGN PATENT DOCUMENTS

CN    102372817 A    3/2012
JP    H01-134449 A    5/1989
(Continued)

OTHER PUBLICATIONS

Yuta Saito et al., "Fabrication of Hierarchic Porous Films Made from Titanium Dioxide Nanoparticles Stabilized by Amphiphilic Copolymer Containing Catechol Group," Polymer Preprints, Japan, vol. 61, No. 2, pp. 4657-4658 (Sep. 5, 2012).
(Continued)

*Primary Examiner* — Alex A Rolland
(74) *Attorney, Agent, or Firm* — Amster, Rothstein & Ebenstein LLP

(57) ABSTRACT

Provided is a resin for nanoimprinting, which is capable of preventing removal of a transfer-receiving resin from a substrate when a mold is separated during nanoimprinting, and which is also capable of transferring a pattern on a mold to a transfer-receiving resin with high accuracy during thermal nanoimprinting, while improving the throughput. A resin for nanoimprinting, which is represented by formula (1).

(Continued)

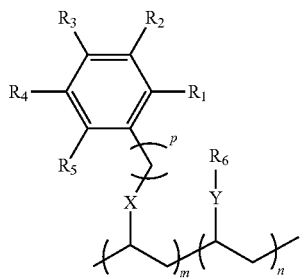

(In the formula, each of $R_1$-$R_5$ independently represents —H or —OH, and at least one of the $R_1$-$R_5$ moieties represents —OH; $R_6$ represents a linear, branched or cyclic alkyl group having 1-20 carbon atoms, an aryl group having 6-20 carbon atoms or an aralkyl group having 7-20 carbon atoms; X represents an amide or an ester; Y may be absent, or represents an amide or an ester; P represents an integer of 1-10; and each of m and n represents an integer of 1 or more.)

4 Claims, 4 Drawing Sheets

(51) Int. Cl.

| | |
|---|---|
| G03F 7/00 | (2006.01) |
| C09D 133/24 | (2006.01) |
| B32B 27/08 | (2006.01) |
| B32B 27/30 | (2006.01) |
| B29C 59/00 | (2006.01) |
| B29C 59/02 | (2006.01) |
| C08F 220/70 | (2006.01) |
| B29K 33/00 | (2006.01) |

(52) U.S. Cl.
CPC ............ *B32B 27/00* (2013.01); *B32B 27/08* (2013.01); *B32B 27/30* (2013.01); *C08F 220/70* (2013.01); *C09D 133/24* (2013.01); *G03F 7/0002* (2013.01); *B29K 2033/00* (2013.01)

(56) References Cited

FOREIGN PATENT DOCUMENTS

| JP | H10-29292 A | | 2/1998 | |
|---|---|---|---|---|
| KR | 20100099205 A | * | 9/2010 | ............ B41M 5/00 |

OTHER PUBLICATIONS

Dae-Geun Choi et al., "Measurement of Surface Adhesion Force of Adhesion Promoter and Release Layer for UV-Nanoimprint Lithography," Journal of Nanoscience and Nanotechnology, vol. 9, pp. 769-773 (2009), American Scientific Publishers.

Hirokazu Oda et al., "Photoreactive Chemisorbed Monolayer Suppressing Polymer Dewetting in Thermal Nanoimprint Lithography," Langmuir, vol. 25, No. 12, pp. 6604-6606 (2009), American Chemical Society.

Hiroshi Yabu et al., "Thermal Nanoimprint Lithography of Polymer Films on Non-Adhesive Substrates by Using Mussel-Inspired Adhesive Polymer Layers," Journal of Materials Chemistry C, vol. 1, No. 8, pp. 1558-1561 (2013), The Royal Society of Chemistry.

Alexander Stepuk et al., "Mussel-Inspired Load Bearing Metal-Polymer Glues," Chemical Communications, vol. 48, No. 50, pp. 6238-6240 (2012), The Royal Society of Chemistry.

International Search Report dated Feb. 25, 2014 in connection with PCT International Patent Appln. No. PCT/JP2013/080635, 4 pages with English translation.

Machine translation of detailed description of JP 10-029292 acquired on Jun. 6, 2018.

* cited by examiner (1)                       (2)

PVA(Tg~85°C)/PDOPA/glass      PVB(Tg~70°C)/PDOPA/glass (1)                       (2)

RESIN FOR NANOIMPRINTING, LAMINATE CONTAINING RESIN FOR NANOIMPRINTING, PRINTED BOARD CONTAINING RESIN FOR NANOIMPRINTING, AND METHOD FOR PRODUCING NANOIMPRINT SUBSTRATE

CROSS-REFERENCE TO RELATED APPLICATIONS

This application is a divisional of U.S. patent application Ser. No. 14/649,735, filed Jun. 4, 2015, which is a U.S. national phase of PCT International Patent Application No. PCT/JP2013/080635, filed Nov. 13, 2013, which claims priority to Japanese Patent Application No. 2012-266628, filed Dec. 5, 2012, the contents of each of which are incorporated herein by reference in their entirety.

TECHNICAL FIELD

The present invention relates to a nanoimprinting resin, a laminate including said resin, a printed substrate containing said resin, and a method for manufacturing a nanoimprinted substrate, and particularly relates to: a nanoimprinting resin provided between a nanoimprinting substrate and a transfer-receiving resin layer to which a mold (pattern) is transferred, whereby the transfer-receiving resin layer is prevented from detaching when the mold is to be transferred and detached; a laminate including said resin; a printed substrate containing said resin; and a method for manufacturing a nanoimprinted substrate.

TECHNICAL BACKGROUND

As information technology has advanced in recent years, demand has increased for high-speed operation, low-power-consuming operation, the functional integration known as "system LSI," and other advanced technologies brought about by further miniaturization of semiconductor devices. Continued miniaturization of lithographic technology, which is the core technology behind semiconductor devices, presents problems in that the initial cost of lithography devices increases exponentially, and the price of masks for obtaining the same degree of resolution as that of the light wavelength used also rises.

Nanoimprint lithography, proposed by Chou et al. of Princeton University in 1995, has drawn attention as a processing technique having a resolution of 10 nm while being inexpensive. Nanoimprinting is a technique in which a mold is pressed on a transfer-receiving resin layer provided on a substrate, and a nanometer-order pattern formed on the mold is transferred to the transfer-receiving resin layer; fine patterns can be formed using this technique at a lower cost than with existing lithography techniques, making this technique applicable to semiconductor devices and other electronic devices, optical devices, recording media, chemical/biological devices, MEMS, and other industrial machines.

Thermal nanoimprinting and optical nanoimprinting common methods for nanoimprinting; these methods are differentiated by the properties of the transfer-receiving resin. Of these methods, thermal nanoimprinting comprises applying polymethylmethacrylate (PMMA) or another thermoplastic resin to a substrate as a transfer-receiving resin, heating the transfer-receiving resin to or above the glass transition temperature thereof (105° C. for PMMA) and pressing a mold thereagainst, and removing the mold and the substrate after cooling same, whereby a pattern on the mold is transferred to the transfer-receiving resin.

However, in addition to the problem of shared nanoimprinting, in which, when (3) a mold 3 is detached after (2) being pressed against (1) a transfer-receiving resin 2 applied to a substrate 1 as shown in FIG. 1, the transfer-receiving resin 2 detaches together with the mold 3, thermal nanoimprinting presents other problems in that heating and cooling the transfer-receiving resin takes time, reducing throughput.

Applying the transfer-receiving resin to a glass substrate after treating the substrate with a silane coupling agent (see non-patent reference 1), and causing a benzophenone derivative containing a thiol to react with a gold coating on a substrate before forming a polystyrene resin layer as a transfer-receiving resin (see non-patent reference 2), are known as methods for overcoming the problems described above. However, the method described in non-patent reference 1 presents problems in that the material of the substrate is limited to glass due to the silane coupling agent treatment, and the method described in non-patent reference 2 presents problems in that the gold coating is necessary and the combination of substrate and transfer-receiving resin is limited.

PRIOR ARTS LIST

Non-Patent References

Non Patent Document 1: Dae-Geun Choi et al., "Measurement of Surface Adhesion Force of Adhesion Promoter and Release Layer for UV-Nanoimprint Lithography", Journal of Nanoscience and Nanotechnology, Vol. 9, p 769-773, 2009

Non Patent Document 2: Hirokazu Oda et al., "Photoreactive Chemisorbed Monolayer Suppressing Polymer Dewetting in Thermal Nanoimprint Lithography", Langmuir, 2009, 25(12), p 6604-6606

SUMMARY OF THE INVENTION

Problems to be Solved by the Invention

The present invention was designed to overcome the problems described above. After thoroughgoing investigations, it was newly discovered that by laminating a nanoimprinting resin represented by formula (1) below onto a substrate and then laminating a transfer-receiving resin for transferring a mold to the nanoimprinting resin, it is possible to improve the adhesiveness between the substrate and the transfer-receiving resin; prevent the transfer-receiving resin from detaching from the substrate when the mold is detached, irrespective of the type of substrate and transfer-receiving resin; and improve throughput and accurately transfer a pattern from the mold to the transfer-receiving resin because the transfer-receiving resin does not detach from the substrate even under high temperatures when the mold is detached. This is because the transfer-receiving resin firmly adheres to the substrate when thermal nanoimprinting is performed using a thermoplastic resin as the transfer-receiving resin.

[Formula 1]

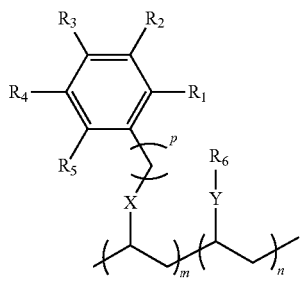

(In the formula, each of $R_1$-$R_5$ independently represents —H or —OH, at least one of $R_1$-$R_5$ representing —OH. $R_6$ represents a $C_{1-20}$ linear, branched, or cyclic alkyl group, a $C_{6-20}$ aryl group, or a $C_{7-20}$ aralkyl group. X represents an amide or an ester. Y represents an amide or an ester, or may be absent. P represents an integer from 1 to 10. m and n are integers equal to or greater than 1.)

Specifically, an object of the present invention is to provide a nanoimprinting resin, a laminate including said resin, a printed substrate containing said resin, and a method for manufacturing a nanoimprinted substrate.

Means to Solve the Problems

The present invention is a nanoimprinting resin, a laminate including said resin, a printed substrate containing said resin, and a method for manufacturing a nanoimprinted substrate, described below.

(1) A nanoimprinting resin represented by formula (1) below.

[Formula 1]

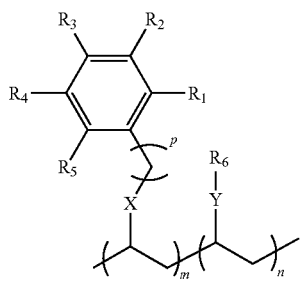

(In the formula, each of $R_1$-$R_5$ independently represents —H or —OH, at least one of $R_1$-$R_5$ representing —OH. $R_6$ represents a $C_{1-20}$ linear, branched, or cyclic alkyl group, a $C_{6-20}$ aryl group, or a $C_{7-20}$ aralkyl group. X represents an amide or an ester. Y represents an amide or an ester, or may be absent. P represents an integer from 1 to 10. m and n are integers equal to or greater than 1.)

(2) The nanoimprinting resin of (1), wherein m and n have a ratio such that m:n=1:99-90:10.

(3) The nanoimprinting resin of (1) or (2), wherein two of the $R_1$-$R_5$ represent —OH.

(4) The nanoimprinting resin of any of (1)-(3), wherein the nanoimprinting resin is used between a substrate and a transfer-receiving resin to which a mold is to be transferred.

(5) A laminate comprising the nanoimprinting resin of any of (1)-(4).

(6) A substrate comprising the nanoimprinting resin of any of (1)-(4).

(7) A method for manufacturing a nanoimprinting substrate, comprising:
a step for laminating the nanoimprinting resin of any of (1)-(3) onto a substrate;
a step for laminating a layer to which a pattern from a mold is to be transferred on a layer of the nanoimprinting resin; and
a step for transferring the pattern from the mold.

(8) The method for manufacturing a nanoimprinting substrate of (7), wherein:
the layer to which the pattern from the mold is to be transferred is a thermoplastic resin, the steps for transferring the pattern from the mold comprising:
a step for heating the substrate on which the thermoplastic resin is laminated to a temperature higher than the glass transition temperature of the thermoplastic resin;
a step for pressing the mold;
a step for cooling the substrate to a temperature lower than the glass transition temperature of the thermoplastic resin; and
a step for detaching the mold.

(9) The method for manufacturing a nanoimprinting substrate of (7), wherein:
the layer to which the pattern from the mold is to be transferred is a thermosetting resin, the steps for transferring the pattern from the mold comprising:
a step for pressing the mold at a temperature lower than the glass transition temperature of the thermosetting resin;
a step for heating the substrate on which the thermosetting resin is laminated to a temperature higher than the glass transition temperature of the thermosetting resin; and
a step for detaching the mold.

(10) The method for manufacturing a nanoimprinting substrate of (7), wherein:
the layer to which the pattern from the mold is to be transferred is formed by a solution containing a polymerizable monomer and a photopolymerization initiator, the steps for transferring the pattern from the mold comprising:
a step for pressing the mold;
a step for cross-linking/curing the polymerizable monomer; and
a step for detaching the mold.

Advantageous Effects of the Invention

A layer of the nanoimprinting resin of the present invention is provided between a substrate and a transfer-receiving resin for transferring a pattern from a mold and nanoimprinted, whereby the transfer-receiving resin can be prevented from detaching from the substrate when the mold is detached, irrespective of the type of substrate and transfer-receiving resin.

Additionally, using the nanoimprinting resin of the present invention makes it possible to improve the throughput of thermal nanoimprinting because it is possible to accurately transfer a pattern from the mold to the transfer-receiving resin when the mold is detached, even under high temperatures.

DESCRIPTION OF THE EMBODIMENTS

The nanoimprinting resin, laminate including said resin, printed substrate containing said resin, and method for manufacturing a nanoimprinted substrate of the present invention will be described more specifically below.

Figure 1:
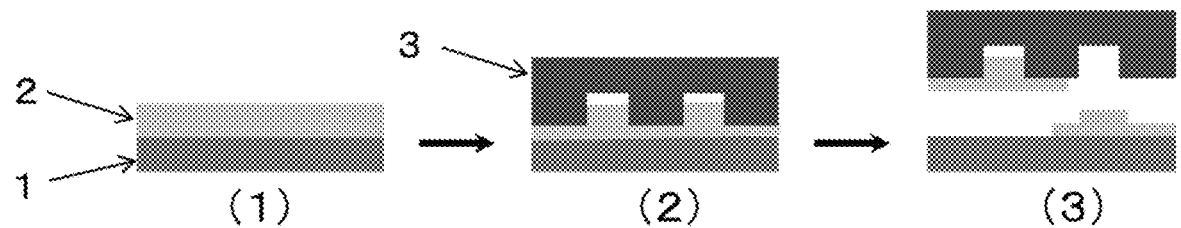
FIG. 1 is a schematic view of a conventional nanoimprinting procedure.
Figure 2:
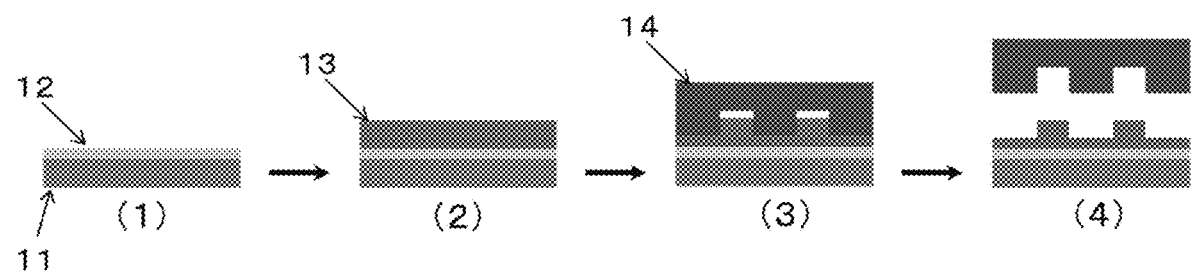
FIG. 2 is a schematic view of the nanoimprinting procedure of the present invention.

FIG. 2 shows a schematic view of the method for manufacturing a nanoimprinted substrate of the present invention; by (1) laminating a nanoimprinting resin 12 of the present invention onto a substrate 11, (2) laminating a transfer-receiving resin or a solution 13 containing a polymerizable monomer and a photopolymerization initiator (may be referred to simply as "transfer-receiving resin 13" below) on the nanoimprinting resin 12, (3) pressing a mold 14 against the laminate produced in (2), and (4) detaching the mold 14 to transfer a pattern from the mold 14 to the transfer-receiving resin 13, it is possible to produce a nanoimprinted substrate.

In the method for nanoimprinting shown in FIG. 2, when thermal nanoimprinting is performed using a thermoplastic resin as the transfer-receiving resin 13, step (3) of FIG. 2 may comprise heating the laminate produced in step (2) to or above the glass transition temperature of the transfer-receiving resin before the mold 14 is pressed thereagainst, and then cooling the laminate to or below the glass transition temperature of the transfer-receiving resin 13; and step (4) may comprise detaching the mold 14. When thermal nanoimprinting is performed using a thermosetting resin as the transfer-receiving resin 13, step (3) may comprise pressing the mold 14 at a temperature lower than the temperature at which the transfer-receiving resin 13 cures, and then heating the laminate to a temperature higher than the curing temperature of the transfer-receiving resin 13; and step (4) may comprise detaching the mold 14.

However, when optical nanoimprinting is performed, step (2) may comprise applying a solution containing a polymerizable monomer and a photopolymerization initiator; step (3) may comprise pressing a mold 14 produced using a transparent material, and then irradiating ultraviolet light or the like on the mold 14 side, or on a base-material side if a transparent base material was used, to cross-link/cure the polymerizable monomer; and step (4) may comprise detaching the mold 14.

There is no particular limitation as to the material of the substrate 11 as long as the substrate 11 can be nanoimprinted; the material may be appropriately selected from: silicon, glass, sapphire, gold, and other inorganic substances; and polyethylene terephthalate (PET), polytetrafluoroethylene (PTFE), polynaphthalene terephthalate (PEN), polycarbonate (PC), triacetylcellulose (TAC), polymethylmethacrylate (PMMA), methylmethacrylate-styrene copolymer (MS), and other resins.

The nanoimprinting resin 12 of the present invention is configured from the resin represented by formula (1) below.

[Formula 1]

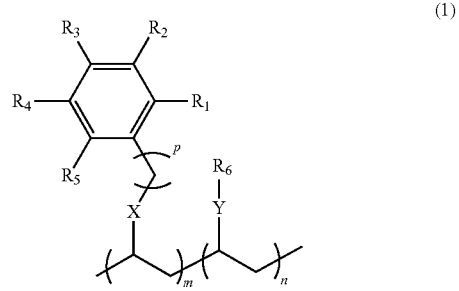

(1)

(In the formula, each of $R_1$-$R_5$ independently represents —H or —OH, at least one of $R_1$-$R_5$ representing —OH. $R_6$ represents a $C_{1-20}$ linear, branched, or cyclic alkyl group, a $C_{6-20}$ aryl group, or a $C_{7-20}$ aralkyl group. X represents an amide or an ester. Y represents an amide or an ester, or may be absent. P represents an integer from 1 to 10. m and n are integers equal to or greater than 1.)

The resin described above is an amphipathic resin configured from a hydrophilic moiety in which at least one —OH group is substituted in a benzene ring, and a hydrophobic moiety $R_6$. At least one of $R_1$-$R_5$ is a —OH group; when there are a plurality of —OH groups, any position may be substituted. Specifically, examples include: phenols having one —OH group; catechols, resorcinols, and hydroquinones having two —OH groups; pyrogallols and phloroglucinols having three —OH groups; tetrahydroxybenzene having four —OH groups; and pentahydroxybenzene having five —OH groups. To optimize the hydrophilic-hydrophobic balance in the benzene ring described above, there are preferably two to three —OH groups, and particularly preferably two —OH groups. Furthermore, the —OH groups are preferably adjacent to each other in order to orient the —OH groups toward the substrate.

The p in formula (1) may be any integer from 1 to 10. X may be selected from amides or esters. Y may also be selected from amides or esters, or may be absent.

There is no particular limitation as to $R_6$ as long as $R_6$ is hydrophobic and has affinity with the transfer-receiving resin; examples include $C_{1-20}$ linear, branched, or cyclic alkyl groups; $C_{6-20}$ aryl groups; and $C_{7-20}$ aralkyl groups.

Specific examples of $C_{1-20}$ linear, branched, or cyclic alkyl groups include methyl, ethyl, n-propyl, 2-propyl, n-butyl, 1-methylpropyl, 2-methylpyopyl, tert-butyl, n-pentyl, 1-methylbutyl, 1-ethylpropyl, tert-pentyl, 2-methylbutyl, 3-methylbutyl, 2,2-dimethylpropyl, n-hexyl, 1-methylpentyl, 1-ethylbutyl, 2-methylpentyl, 3-methylpentyl, 4-methylpentyl, 2-methylpentane-3-yl, 3,3-dimethylbutyl, 2,2-dimethylbutyl, 1,1-dimethylbutyl, 1,2-dimethylbutyl, 1,3-dimethylbutyl, 2,3-dimethylbutyl, 1-ethylbutyl, 2-ethylbutyl, heptyl, octyl, nonyl, decyl, undecyl, dodecyl, tridecyl, tetradecyl, pentadecyl, hexadecyl, heptadecyl, octadecyl, nonadecyl, icosyl, cyclopropyl, cyclobutyl, cyclopentyl, and cyclohexyl. Among the alkyl groups described above, a $C_{1-12}$ alkyl group is preferred.

Specific examples of $C_{6-20}$ aryl groups include phenyl, indenyl, pentalenyl, naphthyl, azulenyl, fluorenyl, phenanthrenyl, anthracenyl, acenaphthylenyl, biphenylenyl, naphthacenyl, and pyrenyl.

Specific examples of $C_{7-20}$ aralkyl groups include benzyl, phenethyl, 1-phenylpropyl, 2-phenylpropyl, 3-phenylpropyl, 1-phenylbutyl, 2-phenylbutyl, 3-phenylbutyl, 4-phenylbutyl, 1-phenylpentylbutyl, 2-phenylpentylbutyl, 3-phenylpentylbutyl, 4-phenylpentylbutyl, 5-phenylpentylbutyl, 1-phenylhexylbutyl, 2-phenylhexylbutyl, 3-phenylhexylbutyl, 4-phenylhexylbutyl, 5-phenylhexylbutyl, 6-phenylhexylbutyl, 1-phenylheptyl, 1-phenyloctyl, 1-phenylnonyl, 1-phenyldecyl, 1-phenylundecyl, 1-phenyldodecyl, 1-phenyltridecyl, and 1-phenyltetradecyl.

m and n are integers equal to or greater than 1; the ratio of m and n (m:n) is preferably 1:99-90:10, more preferably is 2:98-80:20, and particularly preferably is 5:95-20:80.

The resin represented by formula (1) is obtained by polymerizing a compound represented by formula (2) below with a compound represented by formula (3) below.

[Formula 2]

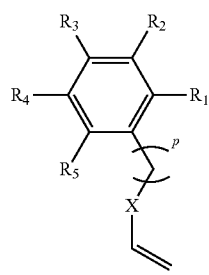

(2)

(In the formula, each of $R_1$-$R_5$ independently represents —H or —OH, at least one of $R_1$-$R_5$ representing —OH. X represents an amide or an ester. P represents an integer from 1 to 10.)

[Formula 3]

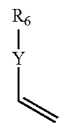

(3)

(In the formula, $R_6$ represents a $C_{1-20}$ linear, branched, or cyclic alkyl group, a $C_{6-20}$ aryl group, or a $C_{7-20}$ aralkyl group. Y represents an amide or an ester, or may be absent.)

Examples of the compound represented by formula (2) above include dopamine acrylamide, resorcin acrylamide, pyrogallol acrylamide, phloroglucinol acrylamide, and tetrahydroxybenzene acrylamide. Other examples include acrylamide and acrylic derivatives bonded with phenol, catechol, resorcinol, hydroquinone, pyrogallol, phloroglucinol, or tetrahydroxybenzene by an alkyl group.

Examples of compounds used as the compound represented by formula (2) above include dopamine hydrochloride, resorcin alkylamine hydrochloride, pyrogallol alkylamine hydrochloride, phloroglucinol alkylamine hydrochloride, tetrahydrobenzene alkylamine hydrochloride, phenol alkyl carboxylic acid, resorcin alkyl carboxylic acid, pyrogallol alkyl carboxylic acid, phloroglucinol alkyl carboxylic acid, or tetrahydrobenzene alkyl carboxylic acid as a starting material, and can be synthesized using the procedure described below.

The starting material is added to a buffer solution obtained by dissolving sodium bicarbonate ($NaHCO_3$) and sodium borate in water, and a tetrahydrofuran (THF) solution of methacrylate anhydride is added dropwise while the buffer solution is stirred. At this time, the pH of the solution is preferably maintained at or above 8 using an aqueous solution of NaOH. The solution is stirred overnight, after which the pH of the solution is adjusted to or below 2 using HCl, ethyl acetate is added, and the product is extracted. After the solution is dried using sodium sulfate ($Na_2SO_4$), condensation and recrystallization are performed using an evaporator. Next, a compound obtained by filtration under reduced pressure is recovered and dried in a vacuum, whereby the compound of formula (2), connected to the starting material by a double bond, can be obtained.

When Y is an amide or ester and $R_6$ is a $C_{1-20}$ linear, branched, or cyclic alkyl group, examples of the compound represented by formula (3) above include: methylacrylamide, ethylacrylamide, n-propylacrylamide, 2-propylacrylamide, n-butylacrylamide, 1-methylpropylacrylamide, 2-methylpropylacrylamide, tert-butylacrylamide, n-pentylacrylamide, 1-methylbutylacrylamide, 1-ethylpropylacrylamide, tert-pentylacrylamide, 2-methylbutylacrylamide, 3-methylbutylacrylamide, 2,2-dimethylpropylacrylamide, n-hexylacrylamide, 1-methylpentylacrylamide, 1-ethylbutylacrylamide, 2-methylpentylacrylamide, 3-methylpentylacrylamide, 4-methylpentylacrylamide, 2-methylpentane-3-ylacrylamide, 3,3-dimethylbutylacrylamide, 2,2-dimethylbutylacrylamide, 1,1-dimethylbutylacrylamide, 1,2-dimethylbutylacrylamide, 1,3-dimethylbutylacrylamide, 2,3-dimethylbutylacrylamide, 1-ethylbutylacrylamide, 2-ethylbutylacrylamide, heptylacrylamide, octylacrylamide, nonylacrylamide, decylacrylamide, undecylacrylamide, dodecylacrylamide, tridecylacrylamide, tetradecylacrylamide, pentadecylacrylamide, hexadecylacrylamide, heptadecylacrylamide, octadecylacrylamide, nonadecylacrylamide, icosylacrylamide, cyclopropylacrylamide, cyclobutylacrylamide, cyclopentylacrylamide, cyclohexylacrylamide, and other alkylacrylamides; and methyl ester, ethyl ester, n-propyl ester, 2-propyl ester, n-butyl ester, 1-methylpropyl ester, 2-methylpropyl ester, tert-butyl ester, n-pentyl ester, 1-methylbutyl ester, 1-ethylpropyl ester, tert-pentyl ester, 2-methylbutyl ester, 3-methylbutyl ester, 2,2-dimethylpropyl ester, n-hexyl ester, 1-methylpentyl ester, 1-ethylbutyl ester, 2-methylpentyl ester, 3-methylpentyl ester, 4-methylpentyl ester, 2-methylpentane-3-yl ester, 3,3-dimethylbutyl ester, 2,2-dimethylbutyl ester, 1,1-dimethylbutyl ester, 1,2-dimethylbutyl ester, 1,3-dimethylbutyl ester, 2,3-dimethylbutyl ester, 1-ethylbutyl ester, 2-ethylbutyl ester, heptyl ester, octyl ester, nonyl ester, decyl ester, undecyl ester, dodecyl ester, tridecyl ester, tetradecyl ester, pentadecyl ester, hexadecyl ester, heptadecyl ester, octadecyl ester, nonadecyl ester, icosyl ester, cyclopropyl ester, cyclobutyl ester, cyclopentyl ester, cyclohexyl ester, and other alkyl esters.

When Y is an amide or ester and $R_6$ is a $C_{6-20}$ aryl group, examples include: phenylacrylamide, indenylacrylamide, pentalenylacrylamide, naphthylacrylamide, azulenylacrylamide, fluorenylacrylamide, phenanthrenylacrylamide, anthracenylacrylamide, acenaphthylenylacrylamide, biphenylenylacrylamide, naphthacenylacrylamide, pyrenylacrylamide, and other arylacrylamides; and phenyl ester, indenyl ester, pentalenyl ester, naphthyl ester, azulenyl ester, fluorenyl ester, phenanthrenyl ester, anthracenyl ester, acenaphthylenyl ester, biphenylenyl ester, naphthacenyl ester, pyrenyl ester, and other aryl esters.

When Y is an amide or ester and $R_6$ is a $C_{7-20}$ aralkyl group, examples include: benzylacrylamide, phenethylacrylamide, 1-phenylpropylacrylamide, 2-phenylpropylacrylamide, 3-phenylpropylacrylamide, 1-phenylbutylacrylamide, 2-phenylbutylacrylamide, 3-phenylbutylacrylamide, 4-phenylbutylacrylamide, 1-phenylpentylbutylacrylamide, 2-phenylpentylbutylacrylamide, 3-phenylpentylbutylacrylamide, 4-phenylpentylbutylacrylamide, 5-phenylpentylbutylacrylamide, 1-phenylhexylbutylacrylamide, 2-phenylhexylbutylacrylamide, 3-phenylhexylbutylacrylamide, 4-phenylhexylbutylacrylamide, 5-phenylhexylbutylacrylamide, 6-phenylhexylbutylacrylamide, 1-phenylheptylacrylamide, 1-phenyloctylacrylamide, 1-phenylnonylacrylamide, 1-phenyldecylacrylamide, 1-phenylundecylacrylamide, 1-phenyldodecylacrylamide, 1-phenyltridecylacrylamide, 1-phenyltetradecylacrylamide, and other aralkylacrylamides; and benzyl ester, phenethyl ester, 1-phenylpropyl ester, 2-phenylpropyl ester, 3-phenylpropyl ester, 1-phenylbutyl ester, 2-phenylbutyl ester, 3-phenylbutyl ester, 4-phenylbutyl ester, 1-phenylpentylbutyl ester, 2-phenylpentylbutyl ester, 3-phenylpentylbutyl ester, 4-phenylpentylbutyl ester, 5-phenylpentylbutyl ester, 1-phenylhexylbutyl ester, 2-phenylhexylbutyl ester, 3-phenylhexylbutyl ester, 4-phenylhexylbutyl ester, 5-phenylhexylbutyl ester, 6-phenylhexylbutyl ester, 1-phenylheptyl ester, 1-phenyloctyl ester, 1-phenylnonyl ester, 1-phenyldecyl ester, 1-phenylundecyl ester, 1-phenyldodecyl ester, 1-phenyltridecyl ester, 1-phenyltetradecyl ester, and other aralkyl esters.

However, when Y is absent from formula (3) above and $R_6$ is a $C_{1-20}$ linear, branched, or cyclic alkyl group, examples include propylene, 2-methyl-1-propylene, 1-butene, 2-methyl-1-butene, 3-methyl-1-butene, 3,3-dimethyl-1-butene, 3-methyl-2-ethyl-1-butene, 2,3-dimethyl-1-butene, 2-tertbutyl-3,3-dimethyl-1-butene, 1-pentene, 2-methyl-1-pentene, 3-methyl-1-pentene, 4-methyl-1-pentene, 2-methyl-3-ethyl-1-pentene, 2,4,4-trimethyl-1-pentene, 1-hexene, 2-ethyl-1-hexene, 2-butyl-1-hexene, 3,3-dimethyl-1-hexene, 5-methyl-1-hexene, 4-methyl-1-hexene, 3-methyl-1-hexene, 2,3-methyl-1-hexene, 4,5-dimethyl-1-hexene, 3,4,5-trimethyl-1-hexene, 3,3,5-trimethyl-1-hexene, 2,4-dimethyl-1-hexene, 2,4,4-trimethyl-1-hexene, 4,4-dimethyl-1-hexene, 3-ethyl-1-hexene, 2,3-dimethyl-1-hexene, 1-heptene, 1-octene, 1-nonene, 1-decene, 1-undecene, 1-dodecene, 1-tridecene, 1-tetradecene, 1-pentadecene, 1-hexadecene, 1-heptadecene, 1-octadecene, 1-nonadecene, 1-icosene, cyclopropylene, cyclobutene, cyclopentene, and cyclohexene.

When Y is absent from formula (3) above and $R_6$ is a $C_{6-20}$ aryl group, examples include vinylbenzene(styrene), 1-vinylindene, 5-vinylindene, 1-vinylpentalene, 1-vinylnaphthalene, 2-vinylnaphthalene, 2-vinylazulene, 9-vinyl-9H-fluorene, 2-vinyl-9H-fluorene, 1-vinylphenanthrene, 2-vinylphenanthrene, 3-vinylphenanthrene, 6-vinylphenanthrene, 8-vinylphenanthrene, 1-vinylanthracene, 2-vinylanthracene, 9-vinylanthracene, 1-vinylacenaphthylene, 2-vinylbiphenylene, 1-vinylnaphthacene, 2-vinylnaphthacene, 1-vinylpyrene, and 4-vinylpyrene.

When Y is absent from formula (3) above and $R_6$ is a $C_{7-20}$ aralkyl group, examples include 3-phenyl-1-propylene, 2-phenyl-1-propylene, 4-phenyl-1-butene, 3-phenyl-1-butene, 2-phenyl-1-butene, 5-phenyl-1-pentene, 4-phenyl-1-pentene, 3-phenyl-1-pentene, 2-phenyl-1-pentene, 6-phenyl-1-hexene, 5-phenyl-1-hexene, 4-phenyl-1-hexene, 3-phenyl-1-hexene, 2-phenyl-1-hexene, 7-phenyl-1-heptene, 6-phenyl-1-heptene, 5-phenyl-1-heptene, 4-phenyl-1-heptene, 3-phenyl-1-heptene, 2-phenyl-1-heptene, 8-phenyl-1-octene, 7-phenyl-1-octene, 6-phenyl-1-octene, 5-phenyl-1-octene, 4-phenyl-1-octene, 3-phenyl-1-octene, 2-phenyl-1-octene, 9-phenyl-1-nonene, 8-phenyl-1-nonene, 7-phenyl-1-nonene, 6-phenyl-1-nonene, 5-phenyl-1-nonene, 4-phenyl-1-nonene, 3-phenyl-1-nonene, 2-phenyl-1-nonene, 10-phenyl-1-decene, 9-phenyl-1-decene, 8-phenyl-1-decene, 7-phenyl-1-decene, 6-phenyl-1-decene, 5-phenyl-1-decene, 4-phenyl-1-decene, 3-phenyl-1-decene, 2-phenyl-1-decene, 11-phenyl-1-undecene, 10-phenyl-1-undecene, 9-phenyl-1-undecene, 8-phenyl-1-undecene, 7-phenyl-1-undecene, 6-phenyl-1-undecene, 5-phenyl-1-undecene, 4-phenyl-1-undecene, 3-phenyl-1-undecene, 2-phenyl-1-undecene, 12-phenyl-1-dodecene, 11-phenyl-1-dodecene, 10-phenyl-1-dodecene, 9-phenyl-1-dodecene, 8-phenyl-1-dodecene, 7-phenyl-1-dodecene, 6-phenyl-1-dodecene, 5-phenyl-1-dodecene, 4-phenyl-1-dodecene, 3-phenyl-1-dodecene, 2-phenyl-1-dodecene, 13-phenyl-1-tridecene, 12-phenyl-1-tridecene, 11-phenyl-1-tridecene, 10-phenyl-1-tridecene, 9-phenyl-1-tridecene, 8-phenyl-1-tridecene, 7-phenyl-1-tridecene, 6-phenyl-1-tridecene, 5-phenyl-1-tridecene, 4-phenyl-1-tridecene, 3-phenyl-1-tridecene, 2-phenyl-1-tridecene, 14-phenyl-1-tetradecene, 13-phenyl-1-tetradecene, 12-phenyl-1-tetradecene, 11-phenyl-1-tetradecene, 10-phenyl-1-tetradecene, 9-phenyl-1-tetradecene, 8-phenyl-1-tetradecene, 7-phenyl-1-tetradecene, 6-phenyl-1-tetradecene, 5-phenyl-1-tetradecene, 4-phenyl-1-tetradecene, 3-phenyl-1-tetradecene, and 2-phenyl-1-tetradecene.

The amphipathic polymer of the present invention can be synthesized using the compounds of formula (2) and formula (3) above, using the procedure described below.

The compounds of formula (2) and formula (3) above, as well as azobisisobutyronitrile and another radical polymerization initiator, are dissolved in a mixed solvent of dimethyl sulfoxide (DMSO) and benzene, and the resulting solution is subjected to three freeze-pump-thaw cycles. The solution is heated to 60° C. in a nitrogen atmosphere, and free radical polymerization is performed. After polymerization, the reaction solution is added dropwise to acetonitrile and subjected to centrifugal separation, after which the synthesized polymer is dried under reduced pressure, whereby the nanoimprinting resin of the present invention can be produced. The viscosity of the resulting resin and the solubility for hydrogen bonds may decrease if the weight-average molecular weight is too great, and the resin may not readily form a coating if the weight-average molecular weight is too small; therefore, the weight-average molecular weight of the resin is preferably 5,000-500,000, and more preferably 10,000-100,000. It is possible to adjust the weight-average molecular weight by adjusting the proportions of the initiator and the monomer. The added amounts of the compounds represented by formula (2) and formula (3) may be adjusted using the ratio m:n. "Weight-average molecular weight" in the present invention refers to the weight-average molecular weight as measured through polystyrene reduction using HLC-8320GPC manufactured by Tosoh Corp.

Examples of the nanoimprinting resin of the present invention resulting from the method described above include the resins illustrated below.

[Formula 4]

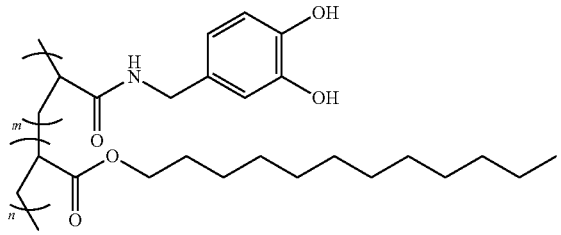

[Formula 5]

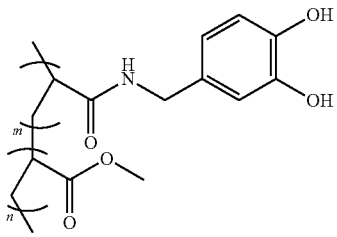

[Formula 6]

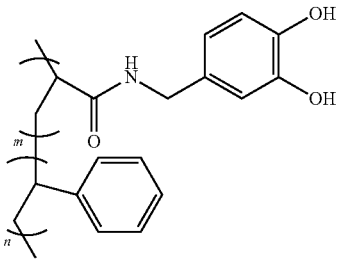

Providing the nanoimprinting resin of the present invention between a substrate 11 and a transfer-receiving resin 13 increases the adhesiveness between the substrate 11 and the transfer-receiving resin 13, and makes it possible to prevent the transfer-receiving resin 13 from detaching from the substrate 11 when a mold is detached; therefore, either thermal nanoimprinting or optical nanoimprinting can be used as the transfer method.

With thermal nanoimprinting, there are no particular limitations as to the transfer-receiving resin 13 as long as the transfer-receiving resin 13 is a thermoplastic resin or thermosetting resin typically used in thermal nanoimprinting. When a thermoplastic resin is used, the thermoplastic resin used as the transfer-receiving resin is heated to or above the glass transition temperature (Tg) thereof and softened, after which a mold having a fine pattern formed thereon is pressed against the transfer-receiving resin, and the transfer-receiving resin is cooled to a temperature lower than the glass transition temperature thereof, whereby the fine pattern is transferred; therefore, the thermoplastic resin preferably has a glass transition temperature lower than the heating temperature used during transferal. When a thermosetting resin is used, the thermosetting resin preferably has a glass transition temperature higher than the heating temperature used when the mold having a fine pattern formed thereon is pressed against the transfer-receiving resin, from the standpoint of compatibility with the thermal nanoimprinting method.

Examples of the thermoplastic resin include polyethylene (PE), polypropylene (PP), polyvinyl chloride (PVC), polystyrene (PS), polyvinyl acetate (PVAc), polytetrafluoroethylene (PTFE), acrylonitrile butadiene styrene resin (ABS resin), AS resin, acrylic resin (PMMA), polyurethane resin (TPU), polyvinyl alcohol (PVA), polycarbonate (PC), polysulfone (PSF), polylactic acid (PLA), polycaprolactone (PCL), polybutadiene (BR), and polyisoprene (IR).

Examples of the thermosetting resin include phenol resin (PF), epoxy resin (EP), melamine resin (MF), urea resin (UF), unsaturated polyester resin (UP), alkyd resin, polyurethane (PUR), and thermosetting polyimide (PI). An appropriate resin may be selected while taking the temperature during mold pressing into consideration.

There is no particular limitation as to the photocuring resin used in optical nanoimprinting as long as the photocuring resin is conventionally used in the field; examples of the photocuring resin include photocuring resins that can be cured using ultraviolet or visible light and have polyester acrylate, acrylic, epoxy acrylate, urethane acrylate, or another type of unsaturated double bond. The photocuring resin includes a polymerizable monomer, or an oligomer obtained by cross-linking a polymerizable polymer with the monomer, and can be cured by cross-linking using a photopolymerization initiator.

As the monomer there is used a material comprising a monomer or oligomer having one or more functional groups, the monomer or oligomer being subjected to ion polymerization or radical polymerization using ions or radicals generated by irradiating a photopolymerization initiator with curing energy rays, to increase the molecular weight or form a cross-linking structure. The "functional groups" referred to here are vinyl groups, carboxyl groups, hydroxyl groups, or other atom groups or bonding schemes used as the source of the reaction. Examples of such monomers and oligomers include epoxy acrylate, urethane acrylate, polyester acrylate, polyether acrylate, silicon acrylate, and other acrylics; and unsaturated polyester/styrene, polyene/styrene, and other non-acrylics; however, acrylics are preferred due to curing speed and wider selection of materials. Representative examples of such acrylics are illustrated below.

Examples of monofunctional groups can include 2-ethylhexyl acrylate, 2-ethylhexyl acrylate/EO adduct, ethoxy diethyleneglycol acrylate, 2-hydroxyethyl acrylate, 2-hydroxypropyl acrylate, 2-hydroxyethyl acrylate/caprolactone adduct, 2-phenoxyethyl acrylate, phenoxy diethyleneglycol acrylate, nonylphenol acrylate/EO adduct, an acrylate obtained by adding captrolactone to nonylphenol/EO adduct, 2-hydroxy-3-phenoxypropyl acrylate, tetrahydrofurfuryl acrylate, furfuryl alcohol acrylate/caprolactone adduct, acryloyl morpholine, dicyclopentenyl acrylate, dicyclopentanyl acrylate, dicyclopentenyloxyethyl acrylate, isobornyl acrylate, 4,4-dimethyl-1,3-dioxolan acrylate/caprolactone adduct, and 3-methyl-5,5-dimethyl-1,3-dioxolan acrylate/caprolactone adduct.

Examples of polyfunctional groups can include hexanediol diacrylate, neopentylglycol diacrylate, polyethyleneglycol diacrylate, tripropyleneglycol diacrylate, hydroxypivalic acid neopentylglycol ester diacrylate, hydroxypivalic acid neopentylglycol ester diacrylate/caprolactone adduct, 1,6-hexandiol diglycidyl ether/acrylate adduct, diacrylate of acetalized compound of hydroxypivalaldehyde and trimethylolpropane, 2,2-bis[4-(acryloyloxydiethoxy)phenyl]propane, 2,2-bis[4-(acryloyloxydiethoxy)phenyl]methane, hydrogenated diacrylate/bisphenolethyleneoxide adduct, tricyclodecanedimethanol diacrylate, trimethylolpropane triacrylate, pentaerythritol triacrylate, triacrylate/trimethylolpropanepropyleneoxide adduct, triacrylate/glycerinepropyleneoxide adduct, dipentaerythritol hexacrylate pentacrylate mixture, dipentaerythritol acrylate/ caprolactone adduct, tris(acryloyloxyethyl)isocyanurate, and 2-acryloyloxyethyl phosphate.

There is no particular limitation as to the photopolymerization initiator to be used; the substance used can be selected from well-known substances. Specifically, examples include: acetophenones, benzophenones, Michler's ketones, benzyls, benzoins, benzoin ethers, benzyldimethyl ketals, benzoin benzoates, α-acyloxime esters, and other carbonyl compounds; tetramethylthiuram monosulfide, thioxanthones, and other sulfur compounds; and 2,4,6-trimethylbenzoyldiphenylphosphine oxide and other phosphorus compounds.

The nanoimprinting resin of the present invention can, without modification, improve the adhesiveness of a substrate with a photocuring resin or other transfer-receiving resin 13; however, in order to further improve adhesiveness, introducing an epoxy group, an azido group, a vinyl group, or the like to the end of the linear, branched, or cyclic alkyl group, aryl group, or aralkyl group represented by $R_6$ in formula (1) and integrally curing the resin when the polymerizable monomers are cured makes it possible to further improve adhesiveness.

Examples of the compound formed by guiding an epoxy group, azido group, vinyl group, or the like to the end described above include glycidyl acrylate, azide acrylate, and 1,2-butadiene.

The fine pattern on the mold 14 may be formed using a well-known method in accordance with the desired mold material and accuracy. For example, it is possible to utilize photolithography, focused ion beam lithography, electron-beam printing, cutting processes, and other such mechanical processes, as well as replica production by molding from a mold matrix, plating, or the like, and other such means.

The nanoimprinting resin 12 and the transfer-receiving resin 13 of the present invention can be laminated on the substrate by first dissolving chloroform or another organic solvent used as a hydrophobic polymer in water used as a water-soluble polymer, and then laminating the nanoimprinting resin 12 and the transfer-receiving resin 13 in the stated order by spin-coating, casting, or another such method. The thicknesses of the nanoimprinting resin 12 and the transfer-receiving resin 13 are preferably 0.1-100 μm. When a solution comprising a polymerizable monomer and a photopolymerization initiator is used as the transfer-receiving resin 13, the solution layer formed by spin-coating or another such method may be set to a thickness of 0.1-100 μm.

The present invention is specifically described in the examples given below, which are provided merely to describe the present invention and to serve as a reference for specific embodiments thereof. Although these examples describe particular, specific embodiments of the present invention, they do not represent any limitation or restriction of the claims of the invention disclosed in the present application.

EXAMPLES

[Production of Nanoimprinting Mold]

Figure 3:
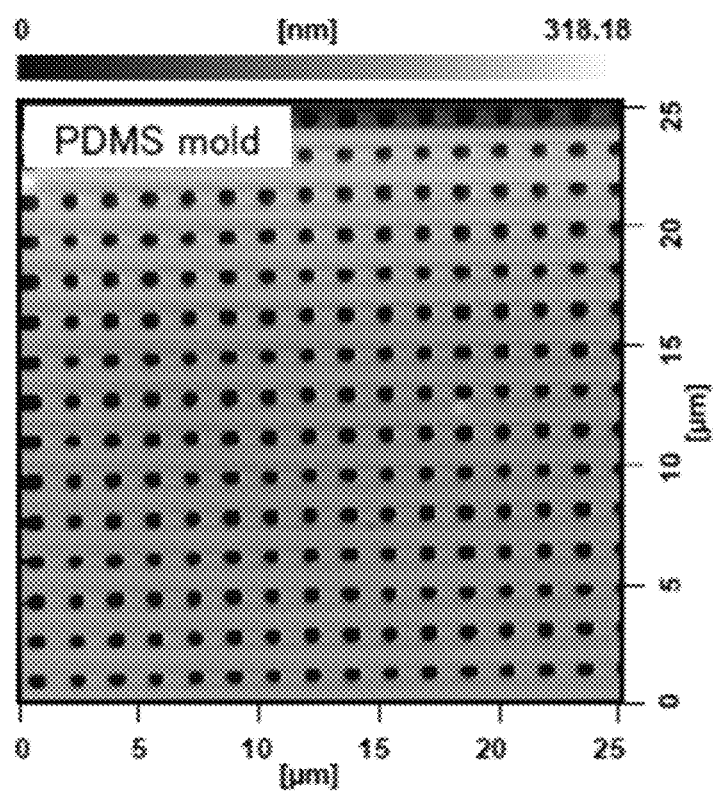
FIG. 3 is a drawing-substitute photograph, specifically an AFM micrograph showing a mold used in one example of the present invention.

A chloroform solution (10 mg/mL) of polystyrene (182427 manufactured by Sigma-Aldrich Corp., weight-average molecular weight: approximately 280,000) was cast on a silicon substrate in which holes 1 μm in diameter were formed at 1-μm intervals in a quadrangular grid, and the substrate was dried at ordinary temperatures, whereby a polystyrene coating was produced. The substrate was then immersed in ethanol, and the polystyrene coating, which had protruding structures, was detached from the silicon substrate using a pincette. The resulting polystyrene coating was placed in a petri dish so that the protruding structures faced upwards, and a 10:1 mixture (Dow Corning Toray Co., Ltd., SylPot184®)) of a polydimethylsiloxane elastomer (PDMS) precursor and a platinum catalyst was cast and then defoamed using low pressure, after which the polystyrene coating was cured at 70° C. over five hours. After curing, the polystyrene coating was dissolved using chloroform (or benzene), whereby a polydimethylsiloxane elastomer mold (may be referred to as "PDMS mold" below) was produced. A micrograph of the resulting PDMS mold, captured by an atomic force microscope (AFM, manufactured by Seiko Instruments Inc., SPI-400), is shown in FIG. 3.

Example 1

[Production of Nanoimprinting Resin]

4.0 g of sodium bicarbonate (198-01315 manufactured by Wako Pure Chemical Ind., Ltd.), 10.0 g of sodium borate (192-01455 manufactured by Wako Pure Chemical Ind., Ltd.), and 5.0 g of dopamine chloride (DOPA, H8502 manufactured by Sigma-Aldrich Corp.) were added to 100 mL of ultrapure water (Milli-Q) produced using an ultrapure water production system made by Millipore. A solution obtained by dissolving 4.7 mL of methacrylate anhydride (276685 manufactured by Sigma-Aldrich Corp.) into 25 mL of tetrahydrofuran (THF: 200-00486 manufactured by Wako Pure Chemical Ind., Ltd.) was added dropwise while the solution obtained as described above was stirred. At this time, the pH of the solution was maintained at or above 8 using 1 mol/L of an aqueous solution of NaOH. The solution was stirred overnight, after which the pH of the solution was adjusted to or below 2 using 6 mol/L of HCl, ethyl acetate was added, and the product was extracted. After the solution was dried using sodium sulfate, condensation and recrystallization were performed using an evaporator. Dopamine methacrylamide (DMA) obtained by filtration under reduced pressure was recovered and dried in a vacuum. To obtain the amphipathic polymer of the present invention, 0.673 mmol of DMA, 5.43 mmol of N-dodecylacrylamide (NDA), and 0.125 mmol of azobisisobutyronitrile were dissolved in a 3:50 mixed solvent of dimethyl sulfoxide (DMSO) and benzene, and the resulting solution was subjected to three freeze-pump-thaw cycles. The solution was heated to 60° C. in a nitrogen atmosphere, and free radical polymerization was performed. After polymerization, the reaction solution was added dropwise to acetonitrile and subjected to centrifugal separation, after which the synthesized polymer was dried under reduced pressure, whereby the nanoimprinting resin (may be referred to as "PDOPA resin" below) of the present invention was produced.

[Nanoimprinting Test (Effect of Nanoimprinting Temperature)]

Example 2

Figure 4:
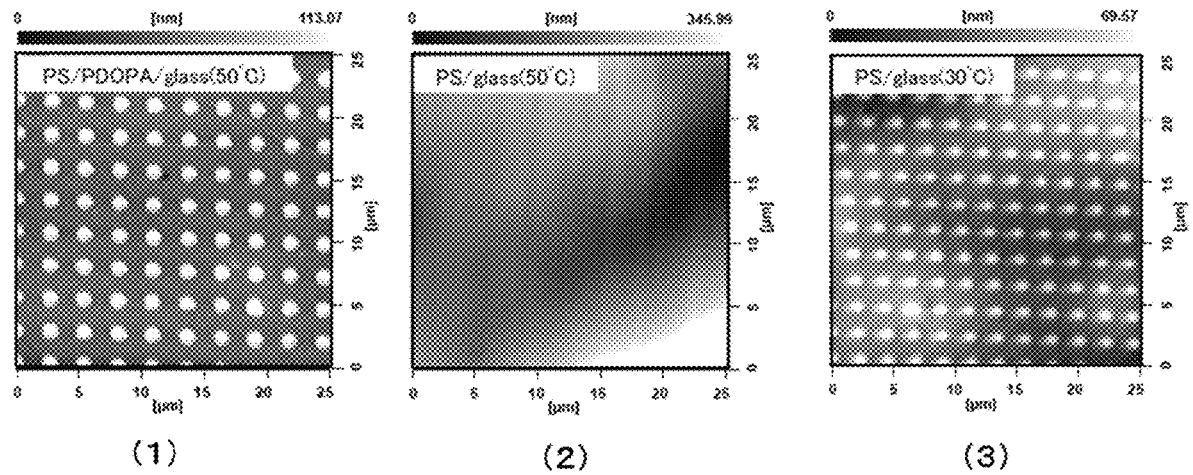
FIG. 4 is a drawing-substitute photograph, specifically an AFM micrograph showing a nanoimprinted substrate surface obtained in example 2, comparative example 1, and comparative example 2.

A chloroform solution (2 mg/mL) of the PDOPA resin obtained as in example 1 was spin-coated at 3,000 rpm onto a glass substrate (cover glass manufactured by Matsunami Glass Ind., Ltd.), and then a chloroform solution (2 mg/mL) of polystyrene (PS: 182427 manufactured by Sigma-Aldrich Corp., glass transition point approximately 100° C.) was spin-coated thereon at 3,000 rpm, whereby a thin-film laminate was produced on the glass substrate. Next, the substrate was disposed on a lower hot stage of a hot stage disposed vertically in a reduced-pressure chamber, the PDMS mold was arranged on the substrate, and the upper hot stage was pressed at a pressure of approximately 100 kPa. The substrate was then annealed under reduced pressure (a pressure of $10^{-1}$ Pa) at 100° C. over one hour, after which air was drawn in and the interior of the pressure chamber was returned to a normal pressure. The hot stage was cooled to a temperature of 50° C., and then the pressure on the hot stage was released, whereby nanoimprinting was performed. The surface structures on the surface of the resulting nanoimprinted substrate were observed using an atomic force microscope (AFM, manufactured by Seiko Instruments Inc., SPI-400). FIG. 4(1) is an AFM micrograph showing the nanoimprinted substrate surface obtained in example 2.

Comparative Example 1

Nanoimprinting was performed using the same procedure as in example 1, except that no spin-coating of the chloroform solution of the PDOPA resin was performed. FIG. 4(2) is an AFM micrograph showing the nanoimprinted substrate surface obtained in comparative example 1.

Comparative Example 2

Nanoimprinting was performed using the same procedure as in example 1, except that no spin-coating of the chloroform solution of the PDOPA resin was performed, and the hot stage was cooled to a temperature of 30° C. after annealing. FIG. 4(3) is an AFM micrograph showing the nanoimprinted substrate surface obtained in comparative example 2.

As shown in FIG. 4(3), when no PDOPA resin layer was provided, sufficiently cooling the glass substrate to 30° C. made it possible to transfer a pattern from the PDMS mold to the polystyrene layer, although the resolution was low. However, when the cooling temperature of the glass substrate was set higher (50° C.), the polystyrene layer provided on the glass substrate was detached therefrom when the PDMS mold was detached, and the pattern could not be transferred from the PDMS mold. Conversely, in example 1, in which the PDOPA resin layer was provided between the glass substrate and the polystyrene layer, the polystyrene layer did not detach when the PDMS mold was detached, even when the cooling temperature of the glass substrate was 50° C., making it possible to accurately transfer the pattern from the PDMS mold.

[Nanoimprinting Test (Effect of Substrate)]

Example 3

Figure 5:
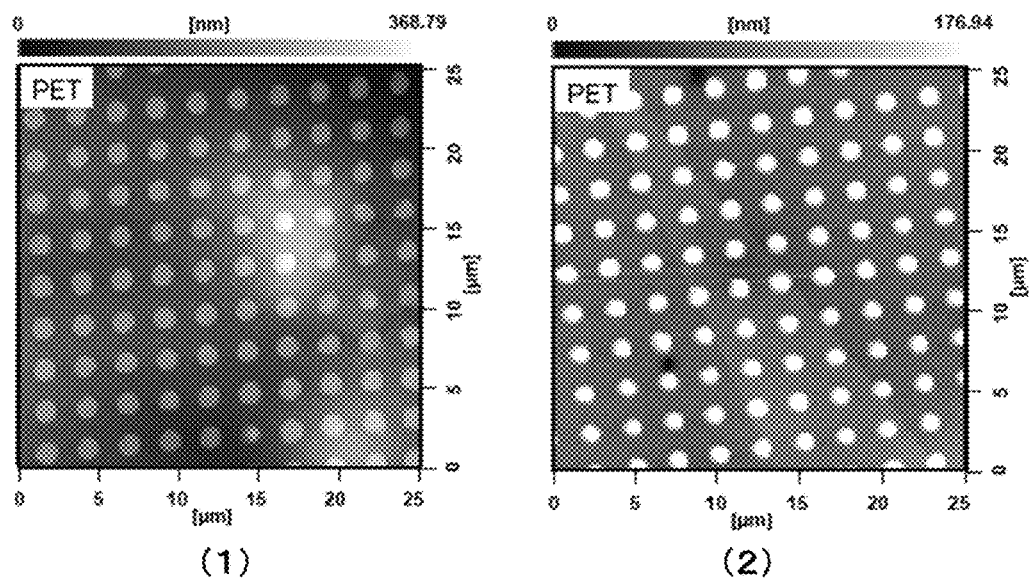
FIG. 5 is a drawing-substitute photograph, specifically an AFM micrograph showing a nanoimprinted substrate surface obtained in example 3 and comparative example 3.

Nanoimprinting was performed using the same procedure as in example 2, except that polyethylene terephthalate (PET, manufactured by Sanplatec Corp.) was used as the substrate instead of glass. FIG. 5(1) is an AFM micrograph showing the nanoimprinted substrate surface obtained in example 2.

Comparative Example 3

Nanoimprinting was performed using the same procedure as in example 3, except that no spin-coating of the chloroform solution of the PDOPA resin was performed. FIG. 5(2) is an AFM micrograph showing the nanoimprinted substrate surface obtained in comparative example 3.

Example 4

Figure 6:
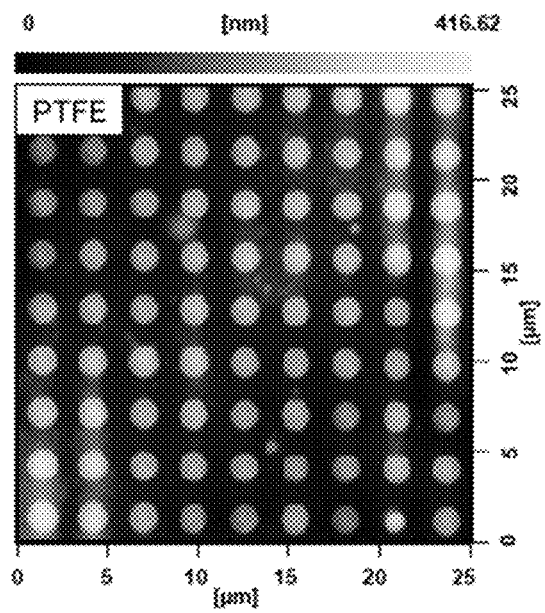
FIG. 6 is a drawing-substitute photograph, specifically an AFM micrograph showing a nanoimprinted substrate surface obtained in example 4 and comparative example 4.
Figure 6:
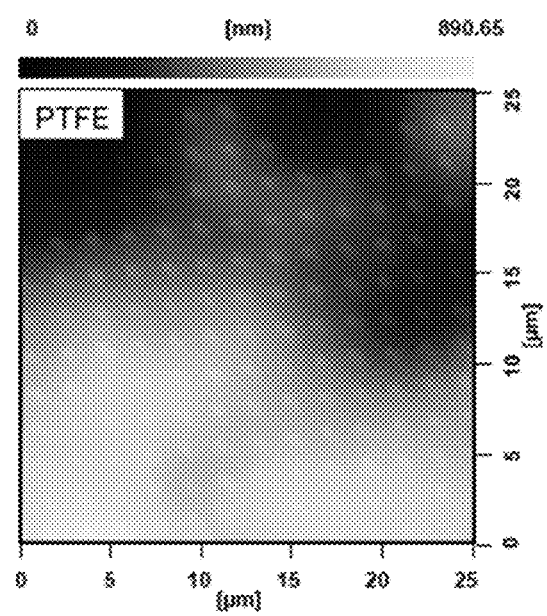

Nanoimprinting was performed using the same procedure as in example 2, except that polytetrafluoroethylene (PTFE, manufactured by Sanplatec Corp.) was used as the substrate instead of glass. FIG. 6(1) is an AFM micrograph showing the nanoimprinted substrate surface obtained in example 4.

Comparative Example 4

Nanoimprinting was performed using the same procedure as in example 4, except that no spin-coating of the chloroform solution of the PDOPA resin was performed, and polytetrafluoroethylene was laminated by casting instead of by spin-coating. FIG. 6(2) is an AFM micrograph showing the nanoimprinted substrate surface obtained in comparative example 3.

As is apparent from comparative examples 1, 3, and 4, when nanoimprinting was performed without providing a PDOPA resin layer, it was possible to transfer a pattern from the PDMS mold to the polystyrene layer, as shown in FIG. 5(2), in comparative example 3, in which highly hydrophobic PET was used as the substrate; however, when lowly hydrophobic glass in comparative example 1, or PTFE in comparative example 4, was used as the substrate, it was impossible to transfer a pattern from the PDMS mold to the polystyrene layer, as shown in FIGS. 4(2) and 6(2). Conversely, in examples 2-4, in which the PDOPA resin layer was provided between the substrate and the polystyrene layer, it was possible to accurately transfer the pattern from the PDMS mold to the polystyrene layer, as shown in FIGS. 4(1), 5(1), and 6(1), irrespective of the type of substrate.

[Nanoimprinting Test (Effect of Laminate Resin)]

Example 5

Figure 7:
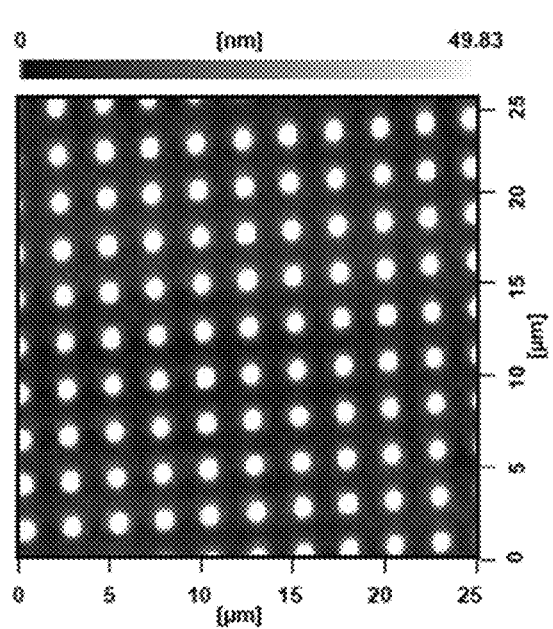
FIG. 7 is a drawing-substitute photograph, specifically an AFM micrograph showing a nanoimprinted substrate surface obtained in example 5 and example 6.
Figure 7:
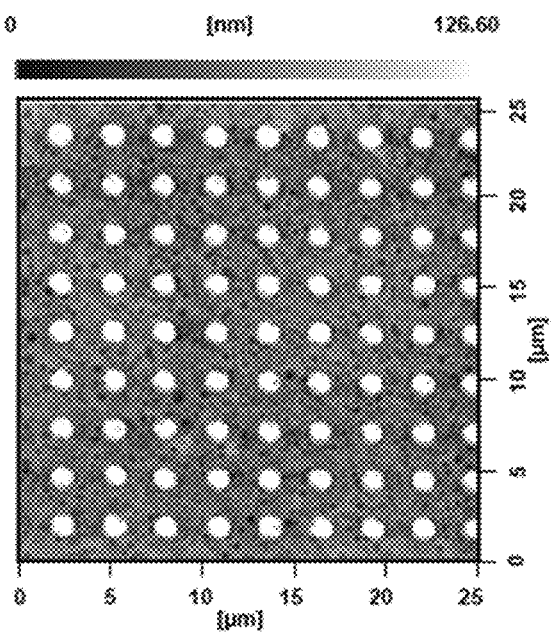

Nanoimprinting was performed using the same procedure as in example 2, except that an aqueous solution (10 mg/mL) of polyvinyl alcohol (PVA, manufactured by Wako Pure Chemical Ind., Ltd., glass transition temperature approximately 85° C.) was used instead of polystyrene. FIG. 7(1) is an AFM micrograph showing the nanoimprinted substrate surface obtained in example 5.

Example 6

Nanoimprinting was performed using the same procedure as in example 2, except that a chloroform solution (5 mg/mL) of polyvinylbutyral (PVB, manufactured by Wako Pure Chemical Ind., Ltd., glass transition temperature approximately 70° C.) was used instead of polystyrene. FIG. 7(2) is an AFM micrograph showing the nanoimprinted substrate surface obtained in example 6.

As is apparent from examples 2, 5, and 6, when the PDOPA resin layer was provided between the substrate and the resin layer to which the PDMS mold was to be transferred, it was possible to accurately transfer the pattern from the PDMS mold, irrespective of the hydrophobicity (examples 2 and 6) or hydrophilicity (example 5) of the resin layer to which the PDMS mold was to be transferred.

As is apparent from examples 1-6 and comparative examples 1-4 described above, providing the PDOPA resin layer of the present invention between the substrate and the resin layer to which the PDMS mold is to be transferred makes it possible to transfer the pattern from the PDMS mold to the transfer-receiving resin, irrespective of the type of substrate and the type of resin layer to which the PDMS mold is to be transferred, even when cooling is not sufficiently performed after nanoimprinting.

INDUSTRIAL APPLICABILITY

Using the nanoimprinting resin of the present invention makes it possible to perform nanoimprinting irrespective of the type of substrate and the type of transfer-receiving resin layer to which a mold is to be transferred, and furthermore makes it unnecessary to sufficiently cool the substrate when the mold is detached. Therefore, because it is possible to perform nanoimprinting using various types of substrate and resin, materials that could not be shaped by conventional nanoimprinting can be used as substrates; therefore, it is possible, e.g., to impart a shape suitable for a cell scaffold to a Teflon® substrate used as a medical material, or to shape a polymeric anti-reflective film on glass. Furthermore, because sufficient cooling after mold detachment is unnecessary, it is possible to reduce manufacturing time and improve manufacturing yield, therefore making nanoimprinting more widely useful.

Therefore, the present invention can be used in semiconductor integrated circuits, members of liquid crystal display devices, optical components, recording media, optical waveguides, protective films, microreactors, nanodevices, chips for medical separation analysis, and other products.

The invention claimed is:

1. A method for manufacturing a nanoimprinting substrate, comprising:
    a step of laminating a nanoimprinting resin onto a substrate, and
    a step of laminating a layer to which a pattern from a mold is to be transferred on a layer of the nanoimprinting resin, and a step of transferring the pattern from the mold, and wherein the nanoimprinting resin is represented by formula (1) below,

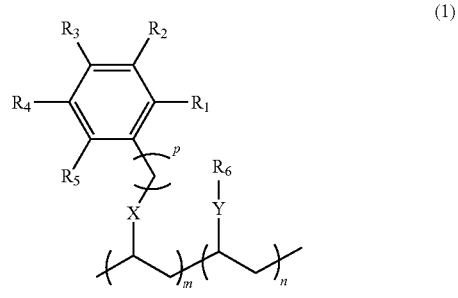

wherein in the formula, each of $R_1$-$R_5$ independently represents —H or —OH, with at least two of $R_1$-$R_5$ representing —OH being adjacent to each other, $R_6$ represents a $C_{1-20}$ linear, branched, or cyclic alkyl group, a $C_{6-20}$ aryl group, or a $C_{7-20}$ aralkyl group, X represents an amide or an ester, Y represents an amide or an ester, or may be absent, P represents an integer from 1 to 10, m and n are integers equal to or greater than 1.

2. The method for manufacturing a nanoimprinting substrate of claim 1, wherein the layer to which the pattern from the mold is to be transferred is a thermoplastic resin, and the steps for transferring the pattern from the mold comprise:
    a step for heating the substrate on which the thermoplastic resin is laminated to a temperature higher than the glass transition temperature of the thermoplastic resin,
    a step for pressing the mold,
    a step for cooling the substrate to a temperature lower than the glass transition temperature of the thermoplastic resin, and
    a step for detaching the mold.

3. The method for manufacturing a nanoimprinting substrate of claim 1, wherein
    the layer to which the pattern from the mold is to be transferred is a thermosetting resin, and the steps for transferring the pattern from the mold comprise:
    a step for pressing the mold at a temperature lower than the glass transition temperature of the thermosetting resin,
    a step for heating the substrate on which the thermosetting resin is laminated to a temperature higher than the glass transition temperature of the thermosetting resin, and
    a step for detaching the mold.

4. The method for manufacturing a nanoimprinting substrate of claim 1, wherein
    the layer to which the pattern from the mold is to be transferred is formed by a solution containing a polymerizable monomer and a photopolymerization initiator, and the steps for transferring the pattern from the mold comprise:
    a step for pressing the mold,
    a step for cross-linking/curing the polymerizable monomer, and
    a step for detaching the mold.

* * * * *